(12) United States Patent
Park

(10) Patent No.: US 6,225,616 B1
(45) Date of Patent: May 1, 2001

(54) SOLID-STATE IMAGE PICKUP DEVICES HAVING SOURCE FOLLOWER BUFFER CIRCUITS THEREIN WITH ACTIVELY CONTROLLED GAIN CHARACTERISTICS

(75) Inventor: Sang-Sik Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/306,177

(22) Filed: May 6, 1999

(30) Foreign Application Priority Data

May 21, 1998 (KR) ................................................ 98-18411

(51) Int. Cl.$^7$ .................................................. H01L 27/00
(52) U.S. Cl. .................................. 250/208.1; 250/214 A; 330/277; 330/307
(58) Field of Search ............................. 250/208.1, 214 A, 250/214 AG, 210; 348/308, 307, 306; 330/277, 262, 282, 307, 308

(56) References Cited

U.S. PATENT DOCUMENTS 5,872,484 * 2/1999 Hynecek ................................ 330/277
6,147,556 * 11/2000 Nakano ................................ 330/277

* cited by examiner

Primary Examiner—Que T. Le
Assistant Examiner—Thanh X. Luu
(74) Attorney, Agent, or Firm—Myers Bigel Sibley & Sajovec

(57) ABSTRACT

Solid-state image pickup devices having source follower buffer circuits therein include load impedance control circuits that boost gain. The source follower buffer circuit comprises a drive transistor and a load transistor that are electrically connected in series (i.e., source-to-drain) between a first reference potential (e.g., Vdd) and a second reference potential (e.g., Vss). The input of the drive transistor is electrically connected to an input terminal. The source follower circuit provides a high impedance path to an input signal Vin and a less than unity voltage gain at an output terminal (i.e., Vout<Vin). The load impedance control circuit improves the voltage gain characteristics of the source follower circuit by automatically increasing the impedance of the load transistor when the output voltage increases in response to an increasing input voltage. As the output voltage increases, the on-state resistance of a pull-down transistor in the load impedance control circuit decreases. Using capacitive coupling, this decrease results in an increase in the on-state resistance of the load transistor and a further increase in the output voltage and gain.

10 Claims, 6 Drawing Sheets

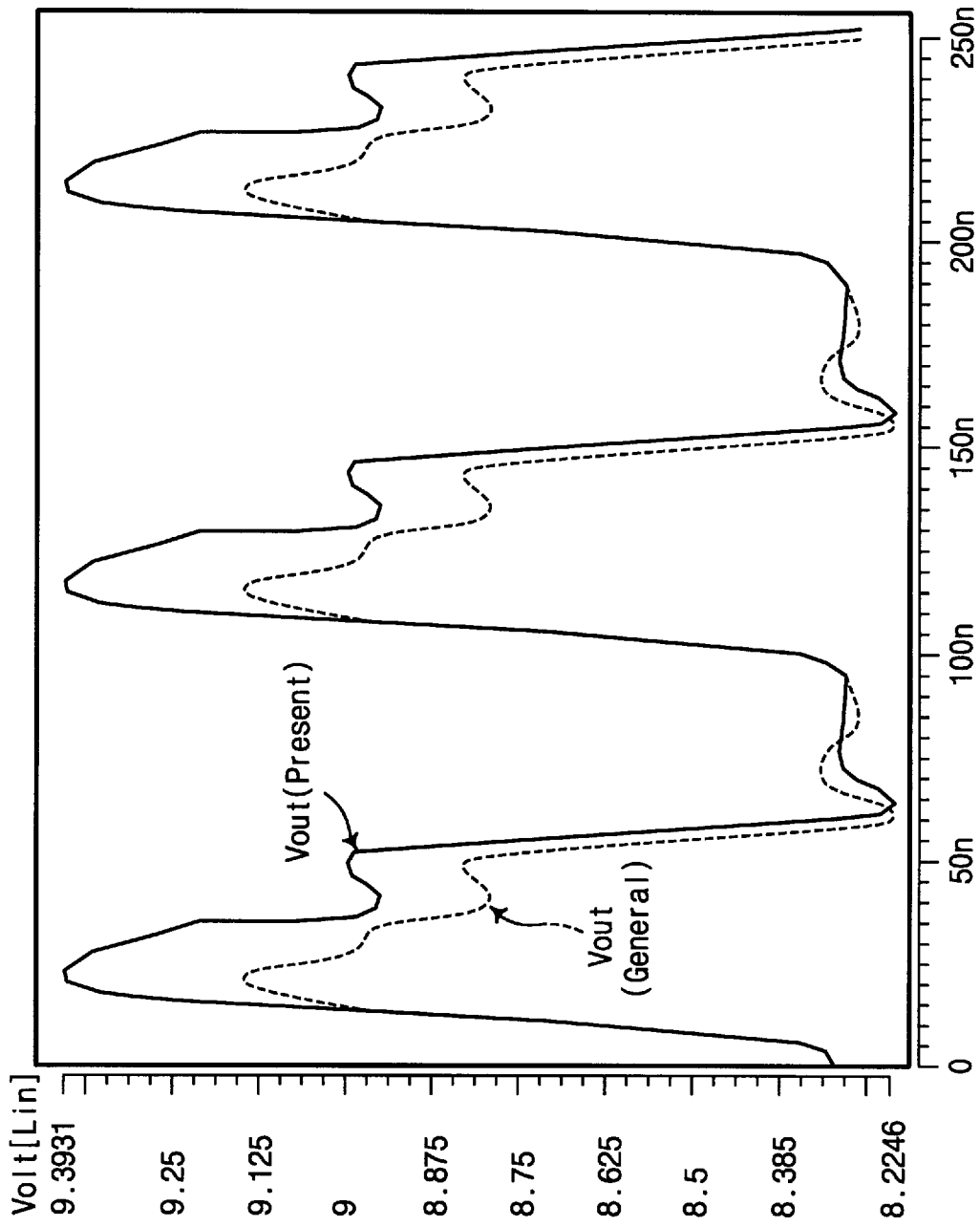

SOLID-STATE IMAGE PICKUP DEVICES HAVING SOURCE FOLLOWER BUFFER CIRCUITS THEREIN WITH ACTIVELY CONTROLLED GAIN CHARACTERISTICS

RELATED APPLICATION

This application is related to Korean Application No. 98-18411, filed May 21, 1998, the disclosure of which is hereby incorporated herein by reference.

FIELD OF THE INVENTION

The present invention relates to integrated circuit devices, and more particularly to solid-state image pickup devices.

BACKGROUND OF THE INVENTION

Solid-state image pickup devices that utilize charge coupled devices (CCDs) can offer superior characteristics including high integration, low power consumption and/or low cost. Based on recent advances, such devices are now highly suitable for broadcast, video, monitoring and digital still camera applications. However, because such highly integrated devices typically generate relatively "weak" signals when capturing an image, it is often necessary to provide amplification of the "captured" signals without degradation or loss of fidelity. Accordingly, preferred signal amplification techniques are desired in highly integrated solid-state image pickup devices.

SUMMARY OF THE INVENTION

It is therefore an object of the present invention to provide improved solid-state image pickup devices.

It is another object of the present invention to provide solid-state image pickup devices with improved signal amplifiers therein.

These and other objects, advantages and features of the present invention are provided by an integrated circuit device (e.g., solid-state image pickup device) that provides a power/current gain to an input signal in a preferred manner using a source follower circuit that can have high input impedance. The source follower circuit comprises a drive transistor and a load transistor that are electrically connected in series (i.e., source-to-drain) between a first reference potential (e.g., Vdd) and a second reference potential (e.g., Vss). The input (e.g., gate electrode) of the drive transistor is electrically connected to an input terminal. The source follower circuit provides a high impedance path to an input signal Vin and a less than unity voltage gain at an output terminal (i.e., Vout<Vin). According to a preferred aspect of the present invention, the gain characteristics associated with the source follower circuit can be improved using a preferred load impedance control circuit.

The load impedance control circuit improves the voltage gain characteristics of the source follower circuit by automatically increasing the impedance of the load transistor when the output voltage increases in response to an increasing input voltage. In particular, as the output voltage increases, the on-state resistance of a pull-down transistor in the load impedance control circuit decreases. Using capacitive coupling, this decrease can provide an increase in the on-state resistance of the load transistor and a further increase in the output voltage and gain.

BRIEF DESCRIPTION OF THE DRAWINGS

FIG. 5B is an enlarged view of a portion of the timing diagram of FIG. 5A.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
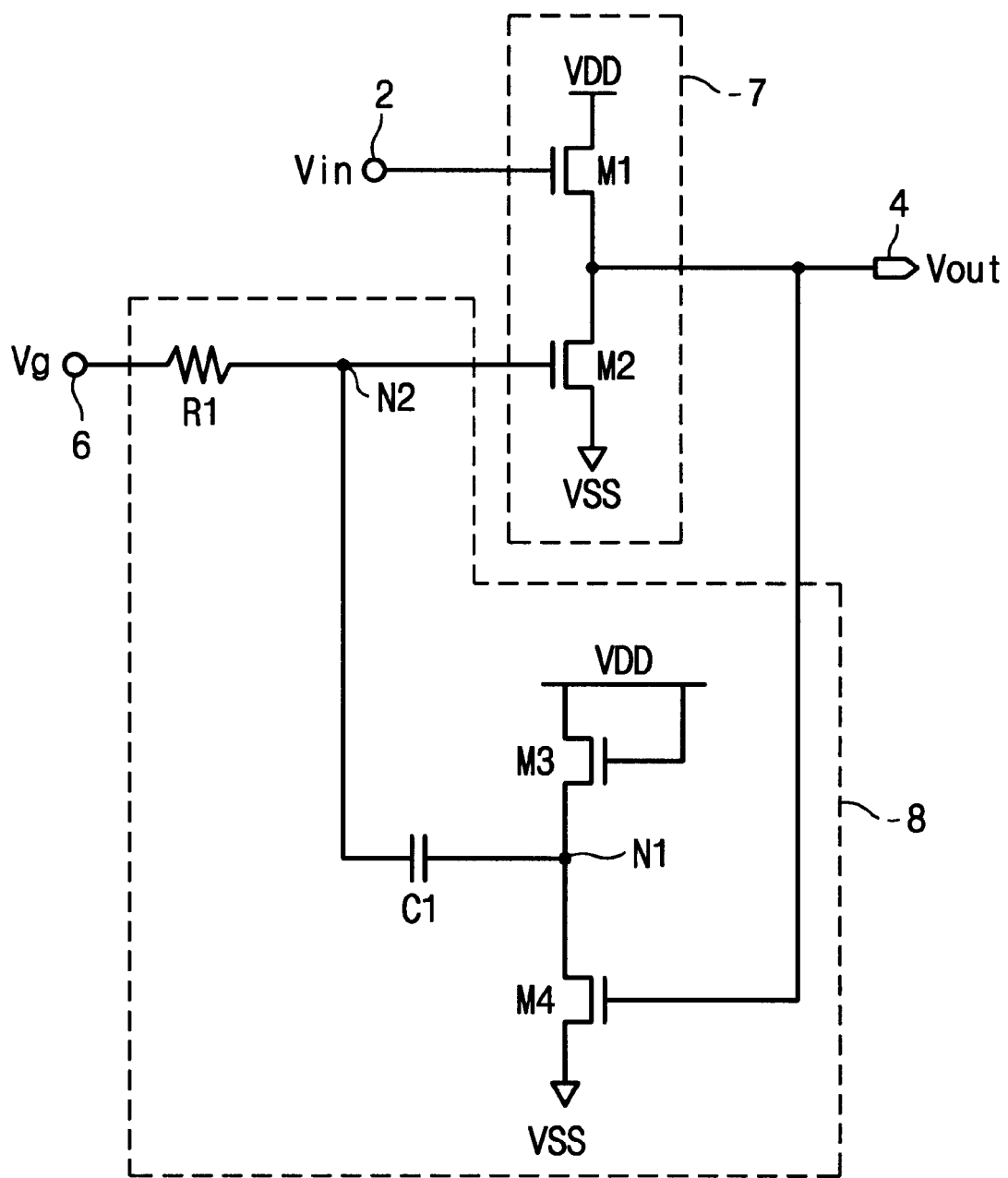
FIG. 1 is an electrical schematic of an integrated circuit device according to a first embodiment of the present invention.

Referring now to FIG. 1, an integrated circuit device 10 according to a first embodiment of the present invention will be described. The integrated circuit device 10 provides a power/current gain to an input signal Vin in a preferred manner using a source follower circuit 7. As illustrated, the source follower circuit 7 comprises an NMOS drive transistor M1 and an NMOS load transistor M2. These transistors are electrically connected in series (i.e., source-to-drain) between a first reference potential (e.g., Vdd) and a second reference potential (e.g., Vss). The input (e.g., gate electrode) of the drive transistor M1 is electrically connected to an input terminal 2. The source follower circuit 7 provides a high impedance path to an input signal Vin and a less than unity voltage gain at an output terminal 4 (i.e., Vout<Vin). According to a preferred aspect of the present invention, the gain characteristics associated with the conventional source follower circuit 7 can be improved using the illustrated load impedance control circuit 8.

In particular, the load impedance control circuit 8 improves the voltage gain characteristics of the source follower circuit 7 by automatically increasing the impedance of the load transistor M2 when the output voltage Vout increases in response to an increasing input voltage Vin. For example, as Vout increases, the on-state resistance of NMOS pull-down transistor M4 decreases and causes the voltage at node N1 to decrease and because of the capacitive coupling across capacitor C1, the voltage at node N2 also decreases. This decrease in voltage at node N2 results in an increase in the on-state resistance of NMOS load transistor M2 and a further increase in the output voltage Vout. As will be understood by those skilled in the art, under quiescent conditions, the on-state impedance of the load transistor M2 will be determined by the voltage at node N2 and since the capacitor C1 will act as an open circuit to DC signals and the input impedance of the gate electrode of load transistor M2 is high, the voltage at node N2 will approximate the voltage Vg at the control terminal 6. During quiescent conditions, the current through the resistor R1 will be negligible and the voltage at node N1 will be approximately equal to Vdd–

$Vth_{M3}$, where $Vth_{M3}$ is the threshold voltage of the normally-on pull-up transistor M3.

Figure 2:
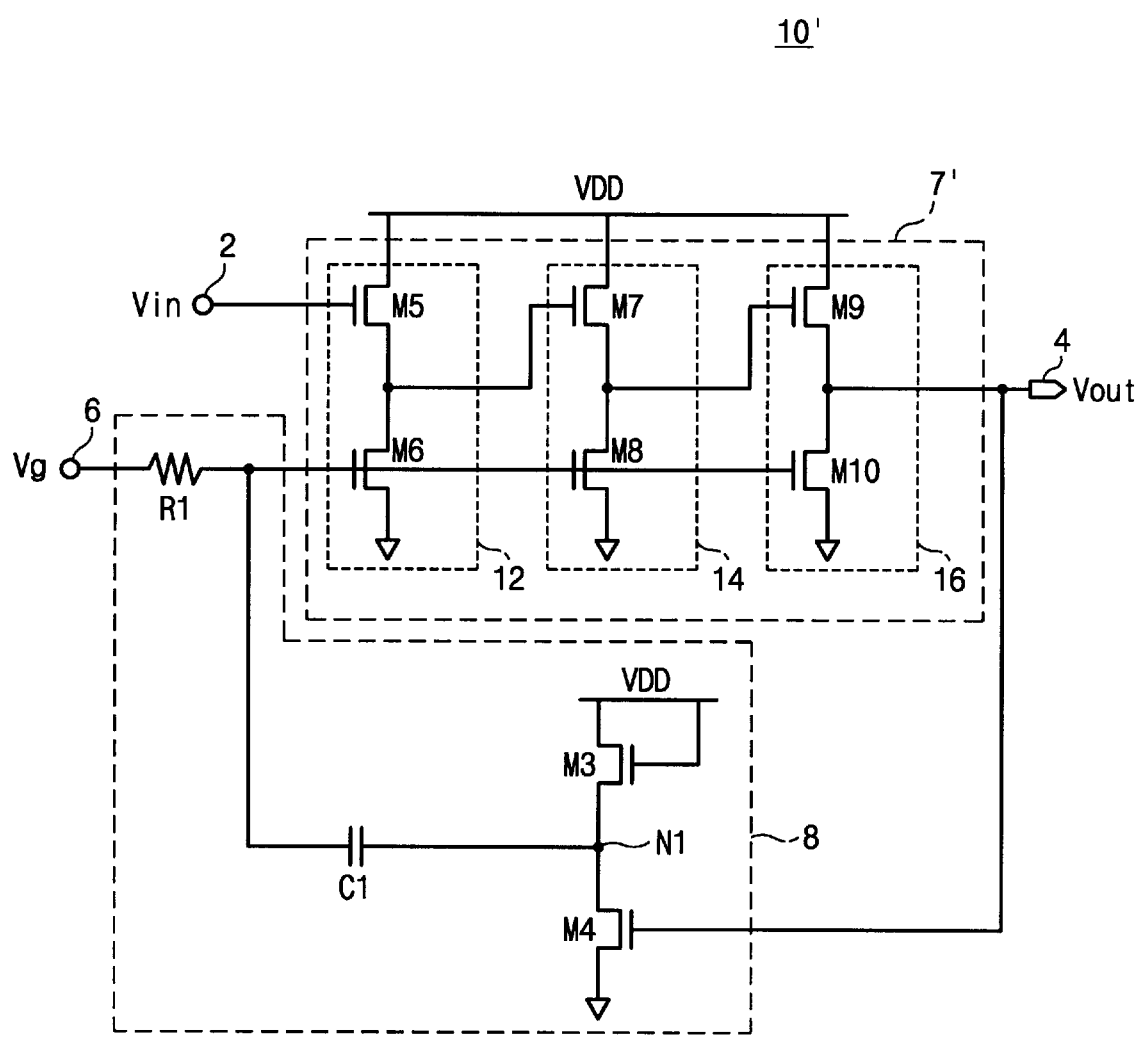
FIG. 2 is an electrical schematic of an integrated circuit device according to a second embodiment of the present invention.

Referring now to FIG. 2, an integrated circuit device 10' according to a second embodiment of the present invention will be described. The device 10' of FIG. 2 is similar to the device 10 of FIG. 1, however, the source follower circuit 7' of FIG. 2 comprises a plurality of stages of source followers 12, 14 and 16, connected as illustrated. In the embodiment of FIG. 2, the load impedance control circuit 8 improves the voltage gain characteristics of the source follower circuit 7' by automatically increasing the impedance of the three load transistors M6, M8 and M10 when the output voltage Vout increases in response to an increasing input voltage Vin. For example, as Vout increases, the on-state resistance of NMOS pull-down transistor M4 decreases and causes the voltage at node N1 to decrease. Because of capacitive coupling across capacitor C1, the voltage at node N2 also decreases. This decrease in voltage at node N2 results in an increase in the on-state resistances of NMOS load transistors M6, M8 and M10 and a further increase in the output voltage Vout. As will be understood by those skilled in the art, under quiescent conditions, the on-state impedance of the load transistors M6, M8 and M10 will be determined by the voltage at node N2 and since the capacitor C1 will act as an open circuit to DC signals and the input impedance of the gate electrode of load transistor M2 is high, the voltage at node N2 will approximate the voltage Vg at the control terminal 6. During quiescent conditions, the current through the resistor R1 will be negligible and the voltage at node N1 will be approximately equal to $Vdd-Vth_{M3}$, where $Vth_{M3}$ is the threshold voltage of the normally-on pull-up transistor M3.

Figure 3:
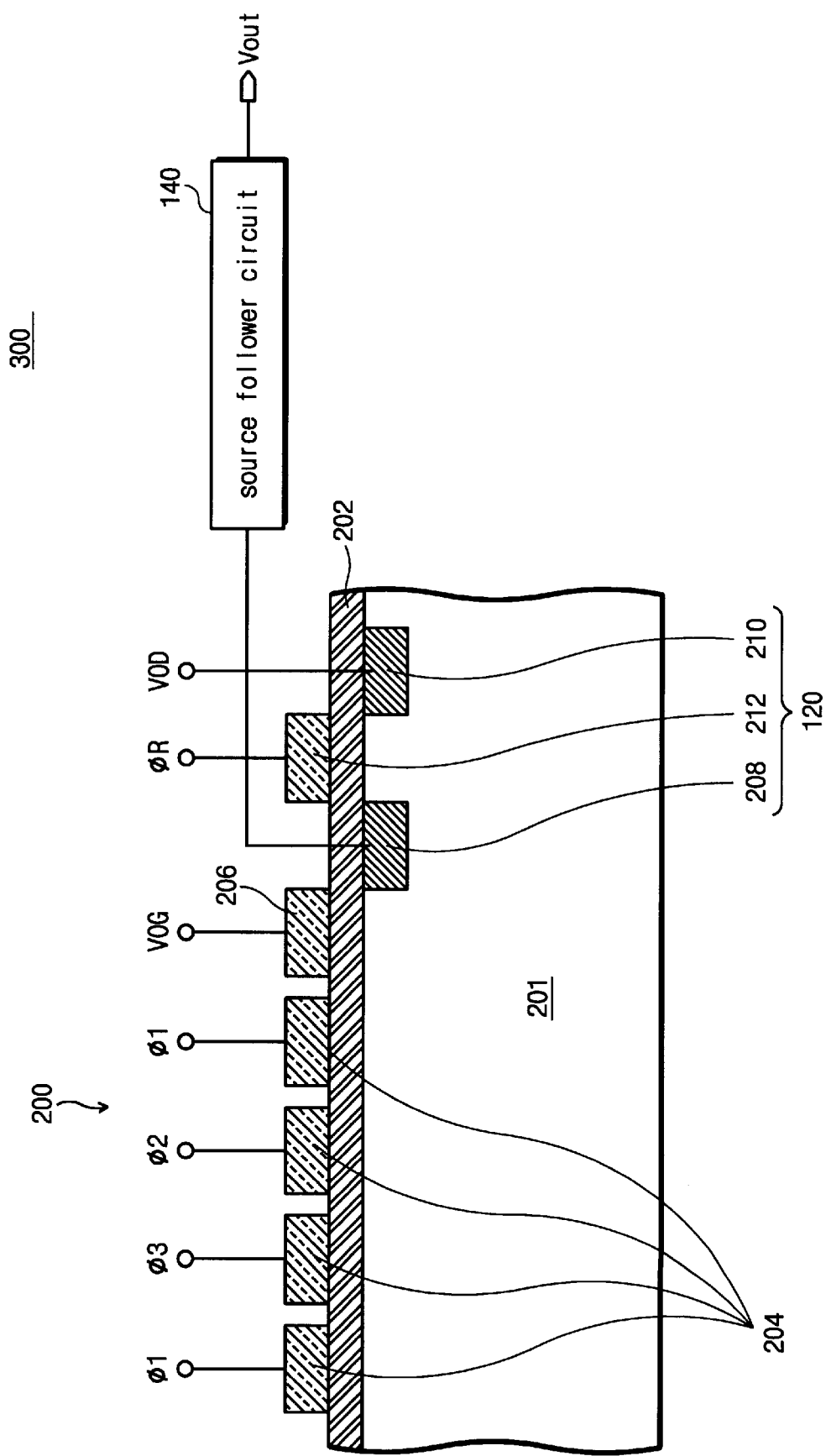
FIG. 3 is a cross-sectional view of a solid-state image pickup device according to a third embodiment of the present invention.
Figure 4:
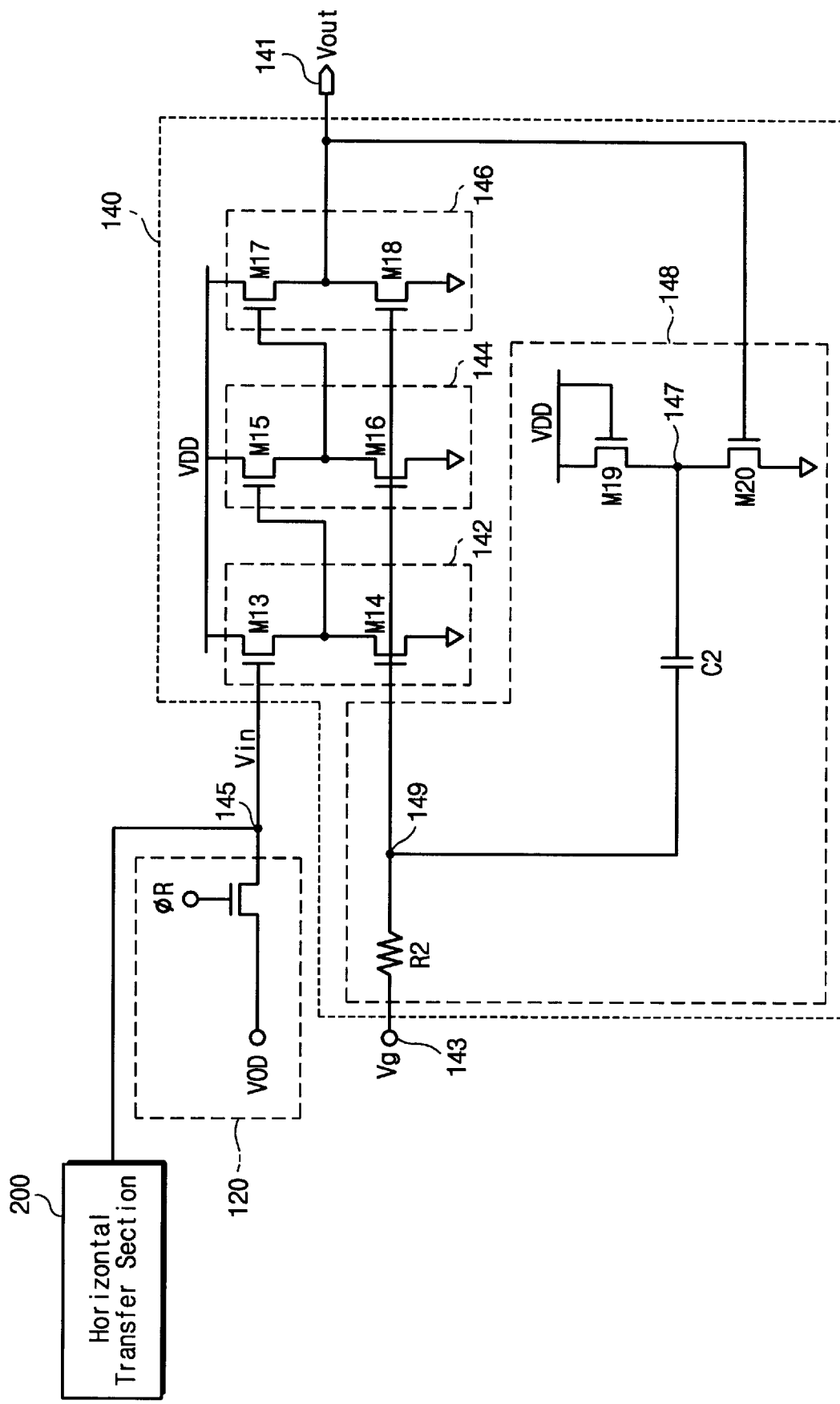
FIG. 4 is an electrical schematic of a solid-state image pickup device according to a fourth embodiment of the present invention.

Referring now to FIGS. 3–4, a preferred solid-state image pickup device 300 comprises a charge coupled device (CCD) having an output electrically coupled to a preferred source follower circuit 140. This preferred source follower circuit 140 operates as described above with respect to the device of FIG. 2. As illustrated best by FIG. 3, a P-type semiconductor substrate 201 may be provided having a surface thereon. An electrically insulating layer 202 may be provided on the substrate 201 and a plurality of electrodes may be provided on the electrically insulating layer 202, as illustrated. As will be understood by those skilled in the art, a lateral CCD may be responsive to a plurality of clock signals Φ1, Φ2 and Φ3 and an output gate voltage VOG. A reset transistor 120 may also be provided having N-type source and drain regions 208 and 210 and an insulated gate electrode 212. As illustrated, the drain region 210 of the reset transistor is electrically connected to an output drain voltage VOD. Based on this configuration, the application of a sufficiently positive reset signal ΦR can be used to withdraw charge that has been passed by the CCD to the source region 208 (i.e., discharge reference node 145 at the input of the preferred source follower circuit 140).

Referring now to FIG. 4, the preferred source follower circuit device 140 of FIG. 4 is similar to the device 10' of FIG. 2. Here, a plurality of source followers 142, 144 and 146 are provided with drive transistors M13, M15 and M17 and load transistors M14, M16 and M18. As described above, the load impedance control circuit (LICC) 148 improves the voltage gain characteristics of the source follower circuit by automatically increasing the impedance of the three load transistors M14, M16 and M18 when the output voltage Vout increases in response to an increasing input voltage Vin. For example, as Vout increases, the on-state resistance of NMOS pull-down transistor M20 decreases and causes the voltage at node N147 to decrease. Because of capacitive coupling across capacitor C2, the voltage at node N149 also decreases. This decrease in voltage at node N149 results in an increase in the on-state resistances of NMOS load transistors M14, M16 and M18 and a further increase in the output voltage Vout. Under quiescent conditions, the on-state impedance of the load transistors M14, M16 and M18 will be determined by the voltage at node N149 and since the capacitor C2 will act as an open circuit to DC signals and the combined input impedances of the gate electrodes of load transistors M14, M16 and M18 is high, the voltage at node N149 will approximate the voltage Vg at the control terminal 143. During quiescent conditions, the current through the resistor R2 will be negligible and the voltage at node N147 will be approximately equal to $Vdd-Vth_{M19}$, where $Vth_{M19}$ is the threshold voltage of the normally-on pull-up transistor M19.

Figure 5A:
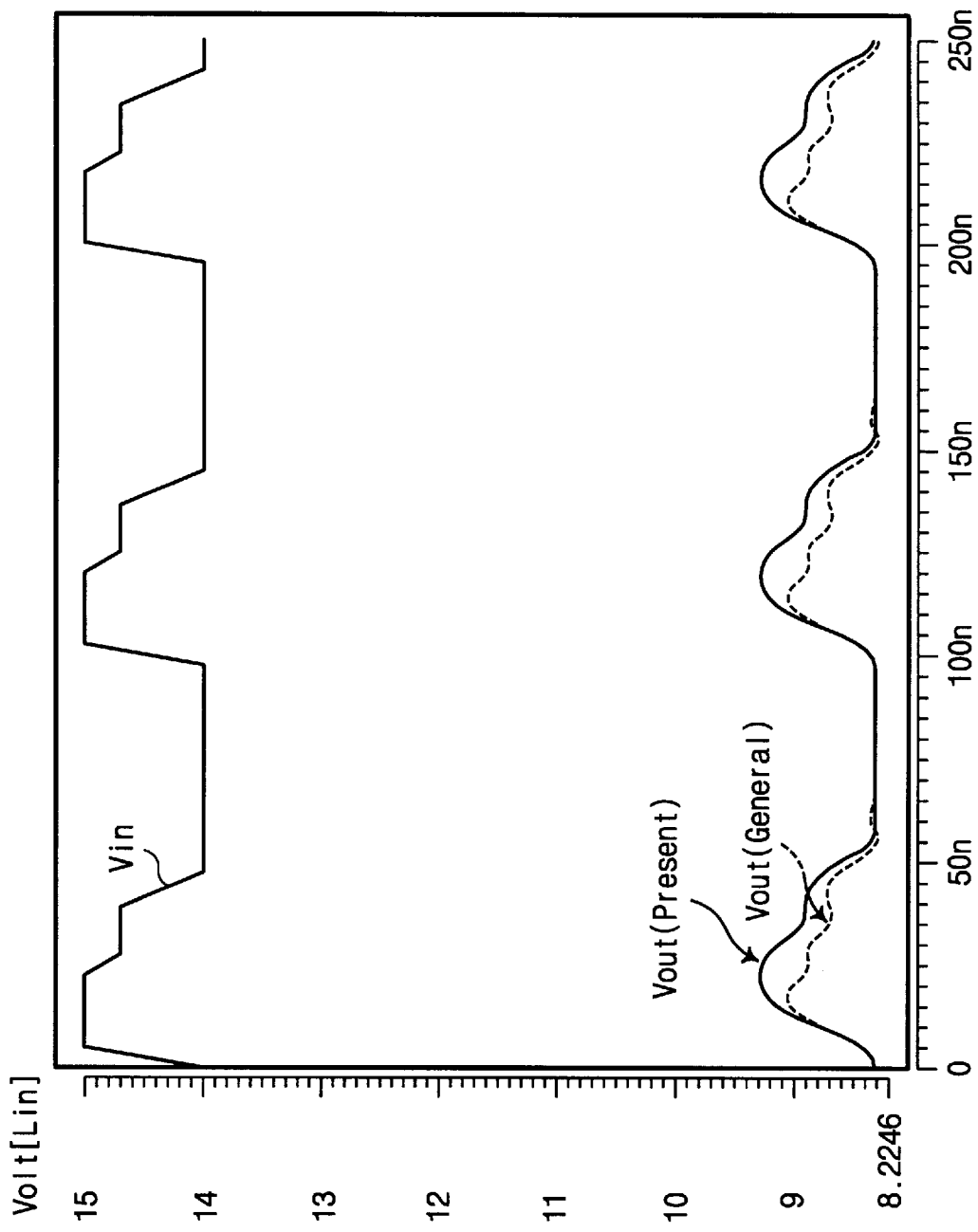
FIG. 5A is a timing diagram which illustrates simulated operation of the integrated circuit device of FIG. 4.

Advantages provided by the present invention can be illustrated by FIGS. 5A–5B. In particular, FIG. 5A is a timing diagram which illustrates operation of the integrated circuit device of FIG. 4 and FIG. 5B is an enlarged view of a portion of the timing diagram of FIG. 5A. As illustrated by FIGS. 5A–5B, the output voltage Vout at node 141 in FIG. 4 (with LICC 148) is greater than the output voltage Vout would be at node 141 in a conventional circuit (without LICC 148).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A solid-state image pickup device, comprising:
   an image signal transfer device;
   a source follower circuit having a drive transistor and a load transistor therein, said drive transistor having an input electrically coupled to an output of said image signal transfer device; and
   a load impedance control circuit which detects an increase in a magnitude of a voltage potential at an output of said source follower circuit and in response thereto drives an input of said load transistor with a signal that increases its on-state impedance.

2. The device of claim 1, wherein the drive and load transistors are electrically connected in series between first and second reference potentials; and wherein said load impedance control circuit comprises an inverter having an input electrically connected to the output of said source follower circuit.

3. The device of claim 2, wherein said load impedance control circuit comprises a capacitor having a first electrode electrically connected to the input of said load transistor and a second electrode electrically connected to an output of said inverter.

4. The device of claim 3, wherein said inverter comprises a normally-on pull-up transistor and a pull-down transistor electrically connected in series between the first and second reference potentials.

5. The device of claim 3, wherein said inverter comprises a normally-on NMOS pull-up transistor and a NMOS pull-down transistor electrically connected in series between the first and second reference potentials.

6. The device of claim 1, wherein said source follower circuit comprises N source followers which each comprise respective drive and load transistors; wherein a drive transistor of a first of the N source followers has an input electrically connected to the output of said image signal transfer device; wherein an output of the Nth source follower is electrically connected to an input of said load impedance control circuit; and wherein an output of said load impedance control circuit is electrically connected to gate electrodes of the load transistors in the N source followers.

7. The device of claim 1, further comprising a reset transistor electrically connected in series between the output of said image signal transfer device and a third reference potential.

8. The device of claim 7, wherein said image signal transfer device comprises a solid-state CCD.

9. The device of claim 3, wherein said load impedance control circuit also comprises a resistor electrically connected in series between the first electrode of the capacitor and a fourth reference potential.

10. An integrated circuit device, comprising:

a source follower circuit having a drive transistor and a load transistor electrically connected in series between first and second reference potentials; and a load impedance control circuit which detects an increase in a magnitude of a voltage potential at an output of said source follower and in response thereto drives an input of said load transistor with a signal that increases its on-state impedance.

* * * * *